United States Patent
Bunte et al.

(10) Patent No.: US 8,894,867 B2
(45) Date of Patent: Nov. 25, 2014

(54) METHOD FOR PRODUCING AND STRUCTURING A ZINC OXIDE LAYER AND ZINC OXIDE LAYER

(75) Inventors: Eerke Bunte, Moeser (DE); Jorj Owen, Gaithersburg, MD (US); Juergen Huepkes, Willich (DE)

(73) Assignee: Forschungszentrum Juelich GmbH, Juelich (DE)

( * ) Notice: Subject to any disclaimer, the term of this patent is extended or adjusted under 35 U.S.C. 154(b) by 0 days.

(21) Appl. No.: 13/390,391

(22) PCT Filed: Aug. 7, 2010

(86) PCT No.: PCT/DE2010/000943
§ 371 (c)(1),
(2), (4) Date: Mar. 5, 2012

(87) PCT Pub. No.: WO2011/026455
PCT Pub. Date: Mar. 10, 2011

(65) Prior Publication Data
US 2012/0190209 A1    Jul. 26, 2012

(30) Foreign Application Priority Data

Sep. 2, 2009  (DE) .................. 10 2009 039 777

(51) Int. Cl.
| | |
|---|---|
| *H01L 21/302* | (2006.01) |
| *H01L 31/18* | (2006.01) |
| *C23C 14/58* | (2006.01) |
| *H01L 31/0236* | (2006.01) |
| *C23C 14/08* | (2006.01) |

(52) U.S. Cl.
CPC ........ *C23C 14/5873* (2013.01); *H01L 31/1884* (2013.01); *Y02E 10/50* (2013.01); *H01L 31/0236* (2013.01); *C23C 14/086* (2013.01)
USPC .............. 216/13; 216/97; 216/101; 216/109; 438/745; 438/750; 438/756; 257/E21.219

(58) Field of Classification Search
None
See application file for complete search history.

(56) References Cited

U.S. PATENT DOCUMENTS

| | | | | |
|---|---|---|---|---|
| 5,804,466 | A | * | 9/1998 | Arao et al. ...................... 438/95 |
| 6,068,755 | A | * | 5/2000 | Matsuda et al. ............... 205/333 |
| 6,106,689 | A | * | 8/2000 | Matsuyama .................. 205/333 |
| 6,123,824 | A | * | 9/2000 | Sano et al. .................... 205/124 |

(Continued)

FOREIGN PATENT DOCUMENTS

| | | |
|---|---|---|
| CN | 101246921 | 8/2008 |
| DE | 11 2005 002 592 | 9/2007 |

(Continued)

OTHER PUBLICATIONS

Berginsky et al. (Berginsky M., Hüpkes J., Schulte M., Schöpe G., Stiebig H., Rech B., Wuttig M. (2007) The effect of front ZnO:Al surface texture and optical transparency on efficient light trapping in silicon thin-film solar cells. Journal of Applied Physics 101, 074903-1-11).

(Continued)

*Primary Examiner* — Allan Olsen
(74) *Attorney, Agent, or Firm* — Jordan and Hamburg LLP

(57) ABSTRACT

Disclosed is a method for producing ZnO contact layers for solar cells. The layers are etched using hydrofluoric acid so as to generate a texture.

18 Claims, 6 Drawing Sheets

(56) References Cited

U.S. PATENT DOCUMENTS

| | | | |
|---|---|---|---|
| 6,674,098 B1* | 1/2004 | Niki et al. | 257/102 |
| 6,936,851 B2* | 8/2005 | Wang | 257/79 |
| 6,951,689 B1* | 10/2005 | Higashikawa | 428/699 |
| 7,235,736 B1 | 6/2007 | Buller et al. | |
| 8,455,754 B2* | 6/2013 | Niira et al. | 136/256 |
| 2002/0100696 A1* | 8/2002 | Sano et al. | 205/333 |
| 2003/0148401 A1* | 8/2003 | Agrawal et al. | 435/7.9 |
| 2005/0016862 A1* | 1/2005 | Sano et al. | 205/305 |
| 2006/0130891 A1* | 6/2006 | Carlson | 136/256 |
| 2007/0108446 A1* | 5/2007 | Akimoto | 257/61 |
| 2008/0063793 A1* | 3/2008 | Abrams et al. | 427/109 |
| 2008/0163917 A1 | 7/2008 | Rech et al. | |
| 2008/0315193 A1* | 12/2008 | Kim et al. | 257/43 |
| 2009/0194157 A1* | 8/2009 | den Boer et al. | 136/256 |
| 2009/0233399 A1* | 9/2009 | Jung et al. | 438/95 |
| 2010/0133470 A1* | 6/2010 | Nakahara et al. | 252/301.6 R |
| 2010/0163526 A1* | 7/2010 | Mayers et al. | 216/47 |
| 2010/0252110 A1* | 10/2010 | Yago et al. | 136/261 |
| 2011/0124139 A1* | 5/2011 | Chang | 438/40 |
| 2011/0126890 A1* | 6/2011 | Borrelli et al. | 136/255 |
| 2011/0135848 A1* | 6/2011 | Edwards et al. | 428/1.1 |
| 2011/0260164 A1* | 10/2011 | Domine et al. | 257/53 |
| 2011/0269264 A1* | 11/2011 | Korevaar et al. | 438/98 |
| 2011/0277827 A1* | 11/2011 | Yang et al. | 136/255 |
| 2012/0295399 A1* | 11/2012 | Kim et al. | 438/104 |
| 2013/0034928 A1* | 2/2013 | Kim | 438/72 |
| 2013/0119374 A1* | 5/2013 | Kataishi et al. | 257/43 |

FOREIGN PATENT DOCUMENTS

| | | |
|---|---|---|
| DE | 20 2007 018 755 | 6/2009 |
| EP | 2 101 358 | 9/2009 |
| JP | 2003-068643 | 3/2003 |
| JP | 2003-243677 | 8/2003 |
| WO | WO-2005/071131 | 8/2005 |
| WO | WO-2009/001919 | 12/2008 |

OTHER PUBLICATIONS

Owen J, et al: Novel etch process to tune crater size on magnetron sputteres ZuO:Al; Phys, Status Solidi A 208, No. 1, 109-113 (2011) / DOI 10.1002/pssa.201026164 [PSSA].

Owen J. et al: Study on the in-line sputtering growth and structural properties of polycrystalline ZnO:Al on ZnO and glass; Journal of Crystal Growth 344 (2012) 12-18 [JCG].

* cited by examiner

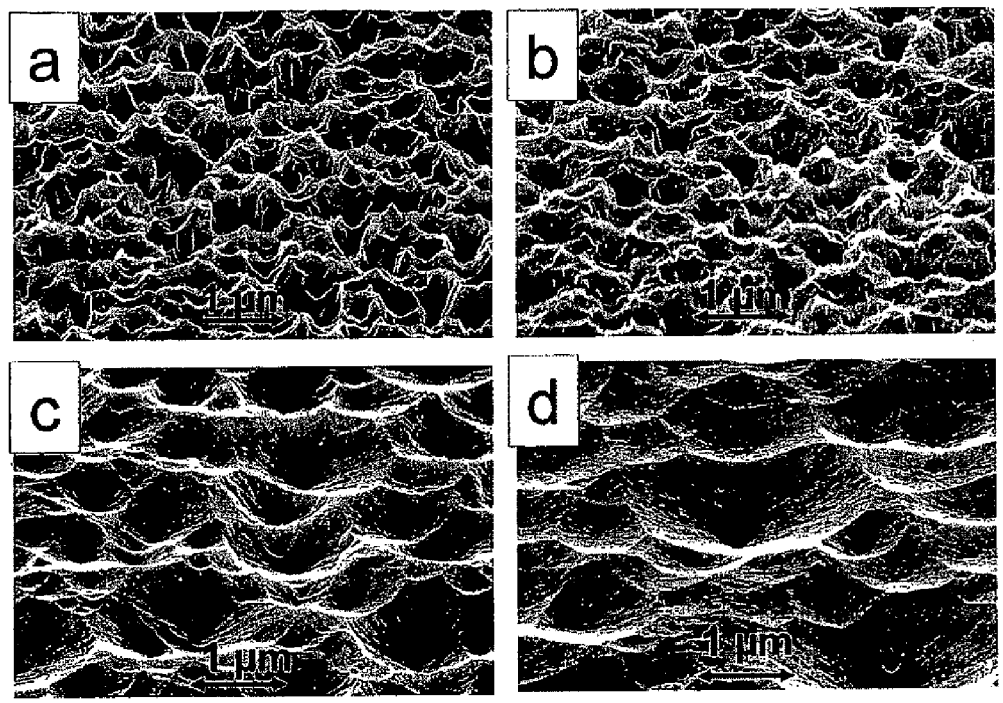
FIG. 3 (with FIG. 3d) as the prior art

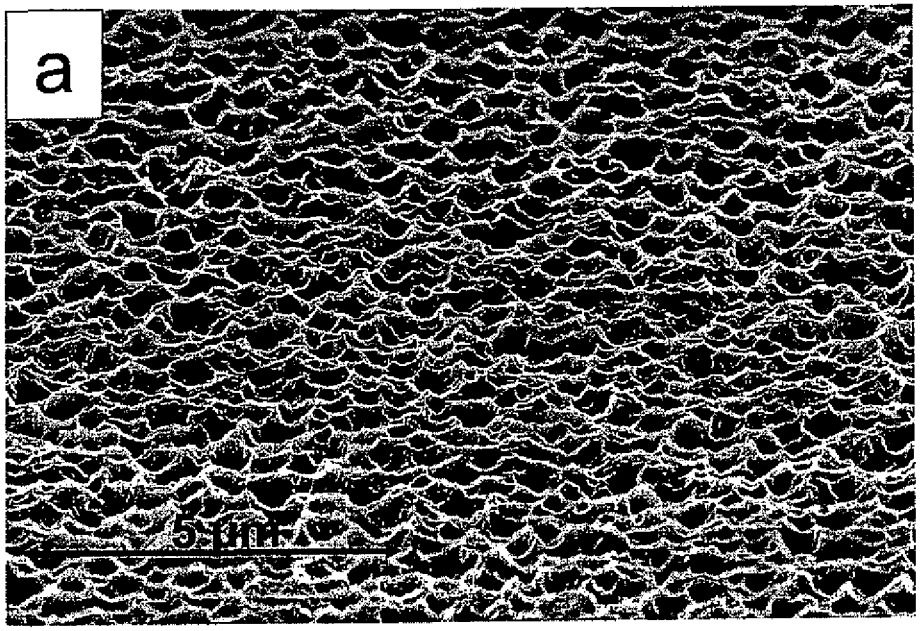
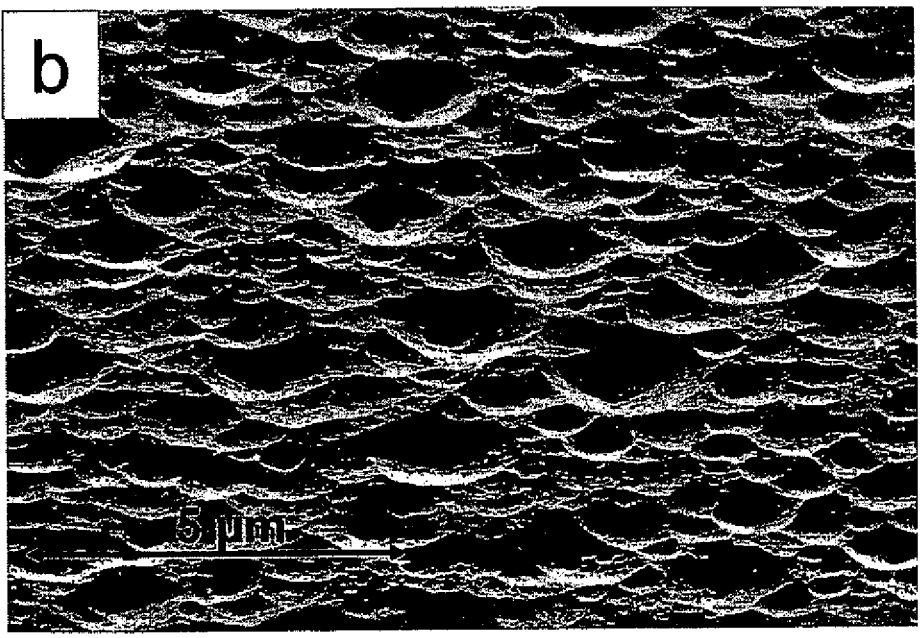
FIG. 4 (with FIG. 4b) as the prior art

METHOD FOR PRODUCING AND STRUCTURING A ZINC OXIDE LAYER AND ZINC OXIDE LAYER

BACKGROUND OF THE INVENTION

The invention relates to a method for producing a zinc oxide layer and to a zinc oxide layer.

Polycrystalline sputtered zinc oxide (ZnO) layers are used as transparent contact layers in optoelectronic components, for example in solar cells. ZnO is an inexpensive alternative to other transparent contact materials such as indium tin oxide (ITO).

It is known that zinc oxide can be etched in hydrochloric acid. The surface of the layer is laterally structured by way of wet-chemical etching of the zinc oxide layer. In an anisotropic etching process, this creates a texture having structures in the nanometer or micrometer range.

Polycrystalline sputtered zinc oxide layers are used in thin-film solar cells as the front contact layers, and as what is known as an intermediate reflector, or, in combination with a reflector, as the back contact layer.

Polycrystalline sputtered zinc oxide layers, which are subsequently structured by way of a wet-chemical process, are used as transparent contact layers in thin-film solar cells. The rms roughness of sputtered zinc oxide layers is usually less than 5 to 15 nanometers. A ZnO layer can be etched at high speed in diluted hydrochloric acid. This increases the rms roughness of the zinc oxide surface, creating craters required for scattering light.

The diameters and depths of the craters can be varied by varying the etching time. In this process, the number and/or density thereof change only insignificantly. The structures also cannot be changed significantly by means of the pH value. As the pH value increases in the acid range, the etching time increases until a defined crater depth has been reached.

In terms of the size and density of the structures, the texture resulting after the etching process actually depends on the ZnO layer properties before etching. These properties, in turn, are influenced by various parameters during the production of the ZnO layers by means of sputtering. The influencing parameters include (a) the substrate and the pretreatment thereof, (b) the sputtering conditions, such as the substrate temperature, the discharge power, the sputtering pressure, the gas composition and the doping. The shapes of the structures and craters that develop during etching can be influenced within narrow limits by the etching solution and the duration. The selection of the etching duration or etching medium changes the numbers and sizes of the craters only insignificantly. Essentially three types of etched surfaces are distinguished when etching in acids:

Type 1: The type 1 surface topography is microscopically rough and has sharp-edged surface structures with crosswise dimensions of approximately 300 nm and very steep flanks. FIG. 1a shows the prior art, which features such a rough surface having an almost Gaussian statistical distribution of the elevations. Typical opening angles of the structures are 40° to 80°. The crosswise dimensions of the craters are less than 300 nm. The topography of the surface after etching depends on the etching time. For a zinc oxide layer having a thickness of approximately 800 nm, of which approximately 150 nm is removed by means of wet-chemical ablation in hydrochloric acid, the rms roughness is approximately 50 to 120 nm and the crosswise correlation length is between 100 and 300 nm.

Type 2: With the type 2 surface topography, the surface is covered almost uniformly with large craters (FIG. 1b). The crosswise crater diameters are 0.5 μm to 3 μm and the crater depths range between 150 nm and 400 nm. The craters typically have opening angles of approximately 120° to 135°. The topography of the surface after etching depends on the etching time. For a layer having a thickness of approximately 800 nm, of which approximately 150 nm is removed by means of wet-chemical ablation in hydrochloric acid, the rms roughness is between 100 and 180 nm, and typically approximately 135 nm, and the crosswise correlation length is between 400 and 1000 nm.

Type 3: The type 3 surface topography likewise has large craters (FIG. 1c), which are surrounded by relatively planar areas. The planar area comprises only small flat craters having a depth of up to approximately 100 nm. Some isolated large craters having a crosswise expanse of up to 3 μm extend to the substrate, whereby a plateau is formed there. The topography of the surface after etching depends on the etching time. For a layer having a thickness of approximately 800 nm, of which approximately 150 nm is removed by means of wet-chemical ablation in hydrochloric acid, the rms roughness is less than 100, typically around 20 to 50 nm, and the crosswise correlation length is between 250 and 800 nm.

For types 2 and 3 in FIGS. 1b and 1c, the height distribution is generally highly asymmetrical. This is due to surface structures forming in a crater-shaped manner as a result of the etching process. Typical opening angles of the structures are 120° to 140°. The rms roughness is highly dependent on the etching duration.

Type 2 (FIG. 1b) differs from type 3 (FIG. 1c) in the number of craters per unit of surface area. Type 2 has a greater crater density. A layer having a type 2 surface thus has higher rms roughness as compared to type 3 with the same layer ablation.

Because the craters make a positive contribution to light scattering, a type-2 surface is better suited for thin-film solar cells than the surface according to type 3 or type 1.

The surface texture of the zinc oxide layer that develops from the etching process causes the light impinging on a solar cell to be scattered. Upon impingement, and after passing through the zinc oxide layer, the light is scattered in the absorber layer and ideally reflected multiple times inside the cell ("light-trapping" effect), resulting in improved cell efficiency.

Crater structures having a diameter of approximately 0.5 to 3 μm, which are uniformly dispersed over the surface of the layer, (type 2) have proven to be advantageous for light scattering in solar cells. The relationship is known from Berginsky et al. (Berginsky M., Hüpkes J., Schulte M., Schöpe G., Stiebig H., Rech B., Wuttig M. (2007) The effect of front ZnO:Al surface texture and optical transparency on efficient light trapping in silicon thin-film solar cells. *Journal of Applied Physics* 101, 074903-1-11).

The zinc oxide layers shown in FIGS. 1a-c are created after etching for 30 seconds in hydrochloric acid (0.5 wt. % (percent by weight)). These layers are usually produced by sputtering. Selection of the sputtering parameters determines the type of surface topography that is obtained after etching. With deposition conditions such as a 2 kW discharge power, a 200 sccm argon gas flow and a 10 μbar deposition pressure, a surface of type 2 is obtained after etching in hydrochloric acid. For this purpose, non-reactive sputtering of ceramic zinc oxide tube targets comprising aluminum oxide doping of 0.5 wt. % at a medium frequency (MF) excitation of 40 kHz is employed. In contrast, with deposition conditions such as a 14 kW discharge power, a 200 sccm argon gas flow and a 20 μbar deposition pressure, a surface similar to type 3 is obtained after etching in hydrochloric acid.

The influence of the target doping of planar ceramic ZnO:Al$_2$O$_3$ targets and that of the substrate temperature on the surfaces created after etching were also analyzed. For example, a radio-frequency (rf) sputtering process at low power was employed. The power density (2 W/cm$^2$) and argon flow (100 sccm) process parameters were kept constant for all the experiments. After etching, type-1 surfaces are obtained, preferably with low substrate temperatures and low target doping levels, for example with 0.2% wt % Al$_2$O$_3$ doping at 170° C. In contrast, after etching, surfaces according to type 3 are obtained with high substrate temperatures and high target doping levels, for example with 2% wt % Al$_2$O$_3$ doping at 460° C. After etching, type-2 surfaces are obtained in a narrow process window with respect to the temperature between type 1 and type 3 with low to medium temperatures, for example with 1 wt % Al$_2$O$_3$ doping and a substrate temperature of approximately 300° C. As the target doping decreases, the process window in which the zinc oxide layer after etching can be etched in a surface of type 2 becomes even narrower.

In addition, the influence of the sputtering pressure and of the substrate temperature on the sputtered zinc oxide layers was analyzed. After etching in 0.5 wt % HCl, a type-1 surface develops with a sputtering pressure of 20 µbar and a substrate temperature of 270° C. A type-2 surface develops after etching in 0.5 wt % with a sputtering pressure of 2.7 µbar and a substrate temperature of 270° C.

Typically, 0.5 wt % (0.137 N) is used for etching the zinc oxide layers. Different etching solutions such as sulfuric acid, phosphoric acid or citric acid are also able to etch zinc oxide. In principle, topographies similar to those obtained with etching in hydrochloric acid develop. The resulting surfaces exhibit similar characteristics to those described as types 1 to 3. Crater-shaped surfaces also develop, with the etching properties being essentially defined by the layer properties, which are determined by the selection of the sputtering parameters.

The location at which the crater develops during the etching process of the ZnO layer is apparently already influenced by the production conditions of the zinc oxide layer as an inherent layer property. Because these parameters, and in particular the substrate temperature during sputtering, cannot be satisfactorily uniformly adjusted on a large industrial scale, even with great technical expenditure, the etching methods according to the prior art have the disadvantage of creating large amounts of undesirable scrap or subregions of a ZnO layer with type-1 and type-3 layers. This is because, in the further production process, the etching medium defines only the shape of the etching structures, but not the surface density thereof. Thus, type-2 layers develop in a partially random manner, and without the required degree of homogeneity and reproducibility.

Using a alkaline solution as the etching medium also does not offer a solution in this respect. Alkaline solutions result in deep holes in the zinc oxide layers, as is shown in FIG. 1d. Physical ablation results in a large number of shallow depressions. In both cases, the density of the points of attack is defined by the layer properties. These layers are not suitable for light scattering in solar cells.

In addition to the lack of reproducibility, the previously known etching methods have other disadvantages, notably:
1. It is not possible to cost-effectively produce double structures, which is to say craters in craters having good light scattering properties for zinc oxide layers on large-surface-area substrates (>0.1 m$^2$). Double structures are desirable because they result in improved light scattering in SnO$_2$ layers.
2. The sizes and numbers of the craters in the etched zinc oxide layers can be controlled only to a very limited extent by the sputtering process or the etching process in various liquid media, such as acids or alkaline solutions.
3. The process windows for producing the zinc oxide layer in which suitable surface structures are created by the etching process are narrow. Highly conductive zinc oxide layers produced at a high deposition rate usually exhibit only low crater density after etching. This has the disadvantage of resulting in the photovoltaic solar modules produced on these zinc oxide layers having low efficiencies.

SUMMARY OF THE INVENTION

It is the object of the invention to provide a cost-effective method, and an etching solution, for producing a zinc oxide layer, with which the crater density and the crater size can be adjusted homogeneously and reproducibly, which is to say substantially independently of the deposition conditions and of the material properties, but rather by way of the etching solution and the etching method itself. It is another object of the invention to provide a method for producing double structures in zinc oxide layers.

According to the invention, the method for producing the zinc oxide layer comprises a step in which the zinc oxide is provided by way of wet-chemical etching using hydrofluoric acid.

Advantageously, a reproducible crater size and crater density can be established in the layer by etching the zinc oxide layer using hydrofluoric acid. The etching method using hydrofluoric acid particularly advantageously modifies the zinc oxide layer in a reproducible manner, even if the layer was produced in a different manner prior to etching. It is thus possible, for the first time, to modify the surface topography of the unetched zinc oxide layer, which is to say, particularly in terms of the crater density and crater size, for a defined zinc oxide layer having predetermined properties.

It was found within the scope of the invention that the structures produced according to the invention are dispersed more regularly over the surface than is possible when using other etching means. Etching using hydrofluoric acid (HF etching) can usually generate a particularly high crater density. The points of attack for the hydrofluoric acid can be controlled by the etching process and the etching solution itself and are not determined exclusively by the deposition conditions and the preexisting properties of the zinc oxide layer.

It was found within the scope of the invention that, in particular the type-3 zinc oxide layer, which is difficult to etch in hydrochloric acid and was deposited at high rates, has regular crater structures after HF etching.

The crater density and the crater size generated by means of etching using hydrofluoric acid are particularly advantageously dependent on the acid concentration. Low acid concentrations (<<1 wt %) result in large and flat craters at low densities.

Hydrofluoric acid at up to 2 N (corresponding to 4 wt %) is particularly advantageous because, in this range, it is possible to vary the surface structure from wide, flat craters (low concentration) to narrow, steep craters (high concentration). The surface structure can thus advantageously be optimized for the corresponding application.

Hydrofluoric acid at least 0.01 N (corresponding to 0.02 wt %) should be employed. During etching, large crater structures are thus generated, which are advantageous for coupling light into the solar cells. Smaller concentrations have the disadvantage of resulting in very long etching times.

An etching duration of more than one second is advantageous in order to achieve an effect on the surface structure. An etching duration that exceeds 300 seconds may result in inhomogeneous surface structures. The aforementioned etching duration also applies to dynamic etching methods using a moving substrate in the etching medium.

In one embodiment of the invention, an acid mixture comprising hydrofluoric acid and other acids, for example hydrochloric acid, is used during the etching process. By selecting the mixing ratio, the crater size can thus be adjusted in a reproducible manner.

In a further embodiment of the invention, a second etching step is carried out using a different acid. It is possible to first etch using a different acid or lye. The term "different acid" also comprises hydrofluoric acid in a different concentration. However, etching can also be carried out using hydrochloric acid or any arbitrary other acid that is chemically different from hydrofluoric acid. A further etching step, which is carried out before or after the etching process in hydrofluoric acid, advantageously modifies the resulting surface structure by way of the subsequent etching process. In this way, double structures, which is to say structures having differing crosswise dimensions, can be generated and smoothing of sharp-edged structures can be achieved.

Independently of the number of etching steps, zinc oxide layers that do not readily develop craters as a result of etching with other acids can be provided with a rough surface by means of hydrofluoric acid. This effect notably applies to zinc oxide layers that were deposited at high deposition rates.

Zinc oxide layers etched by means of hydrofluoric acid and the mixtures thereof with different acids have sharp-edged surfaces. Solar cells deposited thereon have improved optical properties. An etching step that, after hydrofluoric acid etching, is carried out in a different acid, for example diluted hydrochloric acid (HCl), smoothens the sharp edges. This has a positive effect on the fill factor and the electrical properties of the solar cell.

The simultaneous function of a contact layer is advantageous for using such a zinc oxide layer as a light dispersing element in an electro-optical component. For this purpose, the resistivity of the unetched zinc oxide layer should advantageously not exceed $10^{-2}$ ohm*cm, and more particularly $10^{-3}$ ohm*cm, before the etching step. This results in surface resistivity of less than 100 ohm, and more particularly of less than 10 ohm.

Prior to etching, the zinc oxide to be etched should advantageously be deposited on a substrate by way of a sputtering process. Sputtered zinc oxide usually has a strong c-axis texture, which is advantageous for the etching behavior. Zinc oxide layers having crystal orientations wherein the c-axis is not perpendicular to the substrate plane usually exhibit no significant light scattering after a wet-chemical etching process.

The substrate used can be a flexible substrate, for example a metal foil or plastic film. The low weight and the flexibility of the solar modules produced therefrom offer greater application options than rigid and heavy substrates, for example roof integration with low weight-bearing force or the integration of the PV modules in clothing. However, it is also possible to use rigid substrates on which the zinc oxide layer is deposited. These substrates engender less strict requirements in terms of the mechanical properties such as layer tension and adhesion.

The zinc oxide layer to be etched is advantageously between 300 and 1500 nanometers thick. Before the etching step, the layer thickness is advantageously between 200 and 1400 nm, and more particularly between 400 and 900 nm. During etching, advantageously 50 to 1000 nm, and more particularly 100 to 500 nm is ablated by the etching process. In the exemplary embodiments below, the target quantity corresponds to an ablation of approximately 150 nanometers. This ablation has proven to be sufficient for assessing the quality of the etched layer in the etching methods according to the prior art. The layers are measured using a surface profilometer.

The zinc oxide layers are doped, or alloyed with other materials, for better conductivity, improved optical properties and increased long-term stability and then etched. In particular elements of Group III such as aluminum, gallium and indium are considered to be suitable doping atoms. Alloys of zinc oxide with other metal oxides such as MgO or $SnO_2$ can likewise be used. The fraction sums of the metallic foreign atoms relative to the collectivity of atoms in the zinc oxide is advantageously 0.1 to 20 atom %, and more particularly between 0.2 and 10 at % or between 0.3 and 4 at %.

Advantageously, a zinc oxide layer that was deposited at high deposition rates is etched. This will lower production costs. Suitable deposition rates are advantageously above 5 nm/s, and more particularly above 10 nm/s. For dynamic sputtering processes, the static deposition rate must accordingly be converted to a dynamic rate, so that cycle times of less than 2 minutes, and more particularly of less than 1 minute, are achieved.

The zinc oxide layer according to the invention advantageously has a double structure in which small craters are etched in large craters. The large craters can measure more than 300 nm, while the small craters measure less than 300 nm. The crater density of the large craters is 0.3 to 3 $\mu m^{-2}$. The crater density of the smaller craters is advantageously 5 to 100 $\mu m^{-2}$, whereby several small craters fit in a large crater.

Advantageously, layer structures having a substrate comprising at least one such zinc oxide layer, are used in solar cells, for example.

The invention will be described in more detail below based on exemplary embodiments and the accompanying figures.

In the exemplary embodiments below, the target quantity for the ZnO layer corresponds to an ablation of approximately 100 to 500 nm. This ablation has proven to be sufficient for assessing the quality of the etching layer in the etching methods according to the prior art. The layers were measured using a surface profilometer.

BRIEF DESCRIPTION OF THE DRAWINGS

FIG. 3: shows SEM images of the surfaces of ZnO layers that were etched according to exemplary embodiments 2-4 in acid mixtures comprising HF and HCl. The mixing ratios, the related etching times and rms roughness values and crosswise correlation lengths are summarized in Table 1. FIG. 3d) relates to the prior art.

FIG. 4: shows SEM images of the surfaces of high-rate ZnO layers for the following etching conditions: (a) 120 seconds in 1 wt % HF solution according to the etching step of the invention; (b) 30 seconds in 0.5 wt % HCl solution according to the prior art.

Figure 5:
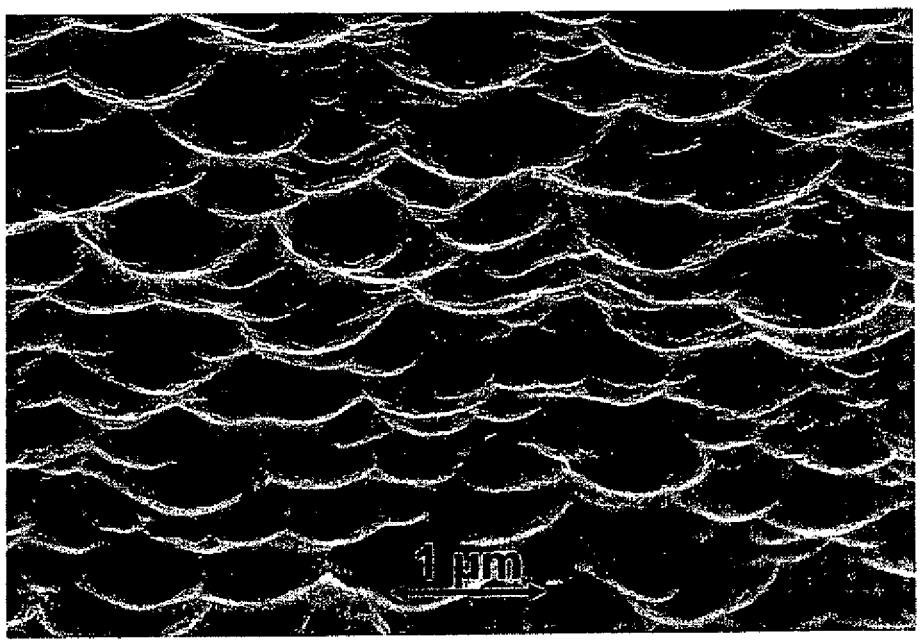

FIG. 5: shows an SEM image of the surfaces of a high-rate ZnO layer, which according to exemplary embodiment 5 was etched initially for 120 seconds in 1 wt % HF solution and subsequently for 4 seconds in 0.5 wt % HCl.

Figure 6:
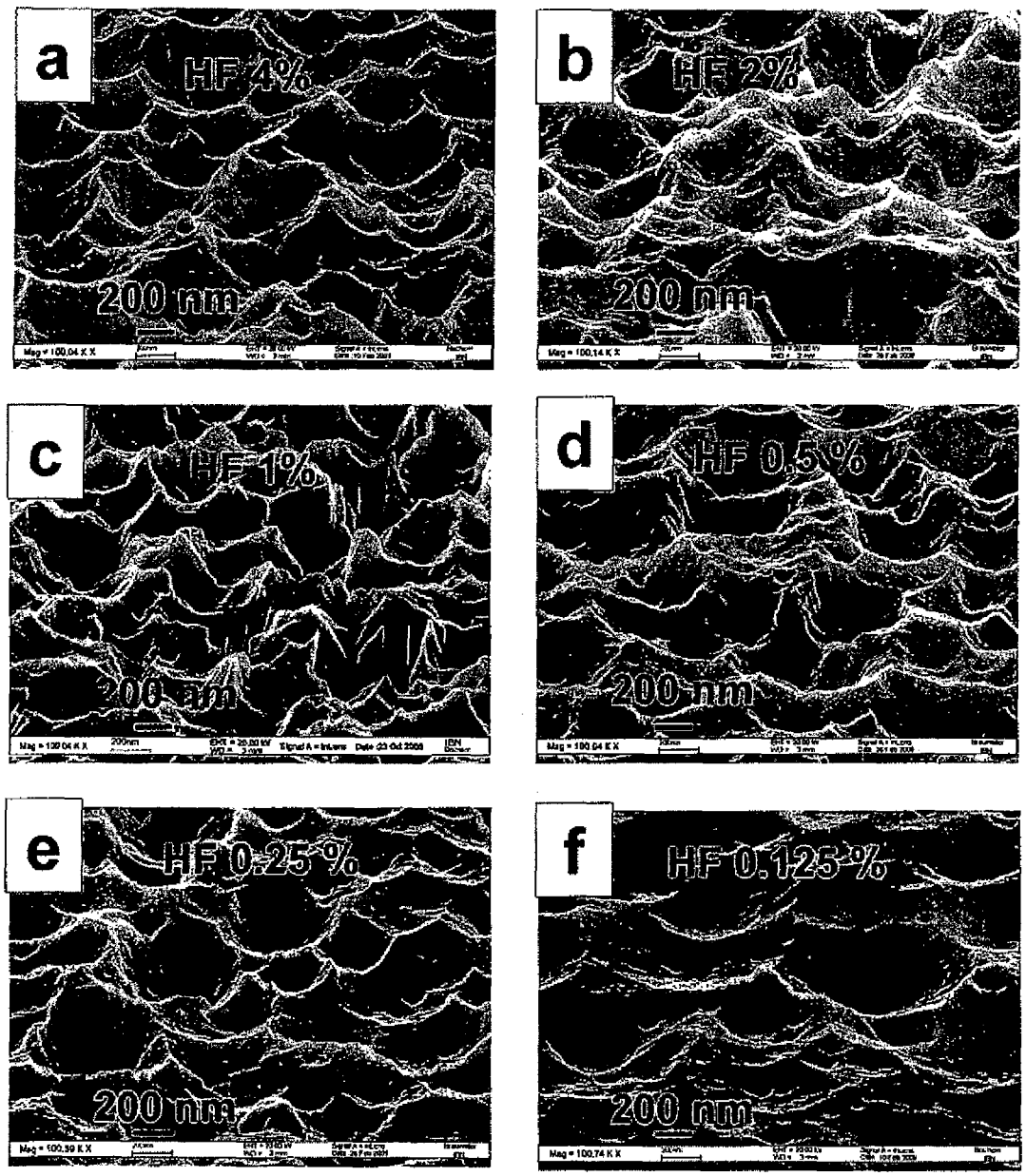

FIG. 6: shows SEM images of the surfaces of zinc oxide layers which were etched in hydrofluoric acid having various concentrations, with the following etching conditions: (a) 4 wt % HF, 120 seconds; (b) 2 wt % HF, 120 seconds; (c) 1 wt % HF, 70 seconds; (d) 0.5 wt % HF, 120 seconds (e); 0.25 wt % HF, 120 seconds; and (f) 0.125 wt % HF, 120 seconds.

DESCRIPTION OF THE PREFERRED EMBODIMENTS

First Exemplary Embodiment

An 800 nm thick ZnO layer was applied to a glass substrate by means of cathode sputtering.

The following coating parameters were selected: a planar ceramic ZnO:$Al_2O_3$ target having a content of $Al_2O_3$ of 1 percent by weight; radio frequency (rf) excitation at 13.56 MHz, cleaned Corning Glass Eagle XG; process gas: argon; operating pressure $1*10^{-3}$ mbar; generator power 2 W/cm², argon gas flow 2×50 standard cubic centimeters (sccm); substrate temperature 300° C.; sputtering system: from Ardenne Anlagentechnik (VISS 300). The static deposition rate was 0.5 nm/s.

Figure 1:
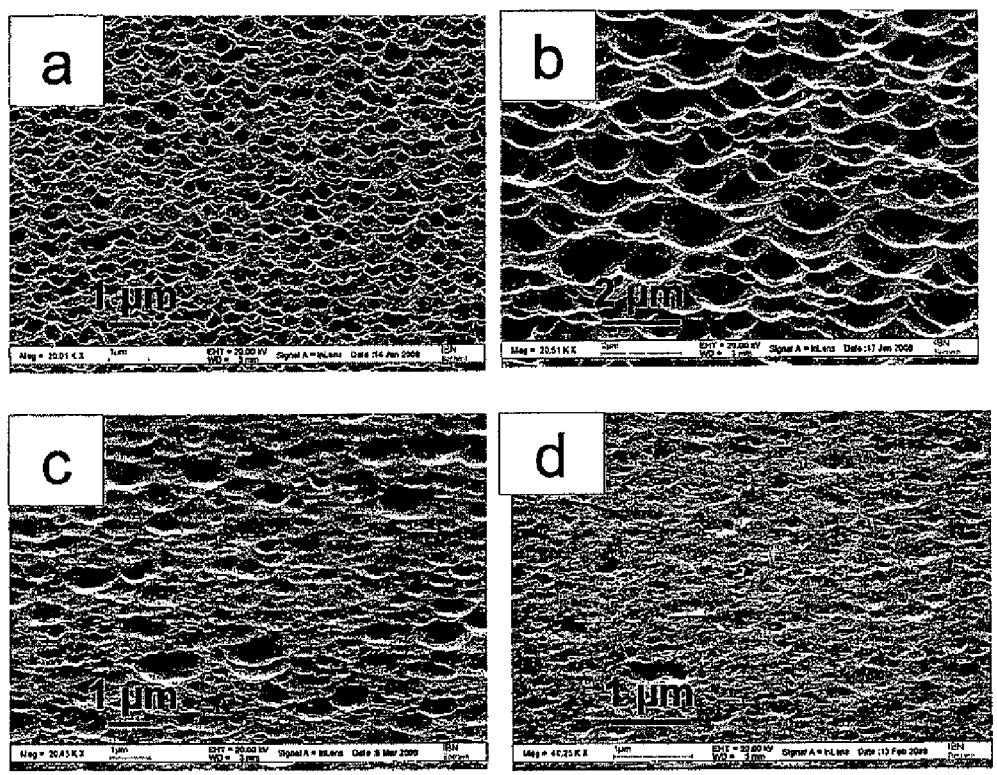
FIG. 1: shows SEM images of etched ZnO surfaces according to the prior art: after an HCl etching step: type 1 (a), type 2 (b), type 3 (c) and after a step of etching in KOH (d)
Figure 2:
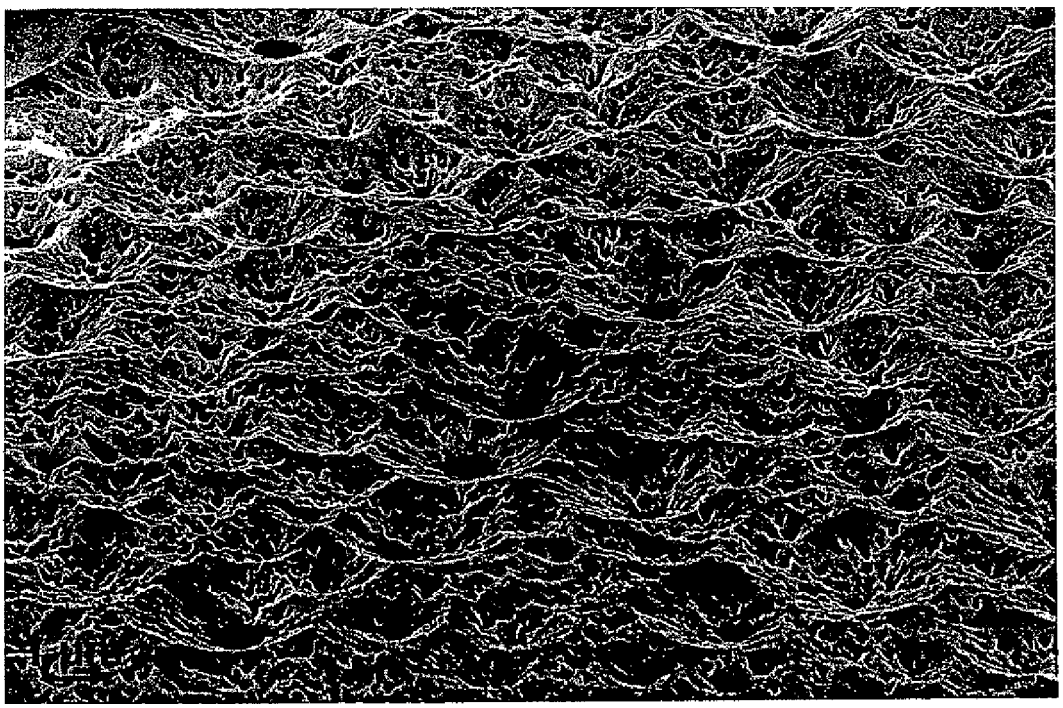
FIG. 2: shows an SEM image of the surface of a zinc oxide layer having a double structure according to exemplary embodiment 1, which was initially etched for 30 seconds in hydrochloric acid and subsequently for 30 seconds in hydrofluoric acid.

The glass panel coated with the zinc oxide oxide is etched for 30 seconds in 0.5 wt % hydrochloric acid (HCl). The known type-2 craters develop (see FIG. 1b, for example). The sample is then etched for 30 seconds in 1 wt % hydrofluoric acid (HF). Because hydrofluoric acid selects different points of attack, a double structure comprising several small craters in large craters develops (FIG. 2).

The concentrations of hydrofluoric acid and hydrochloric acid have no limiting effect and are provided by way of example only. It is thus easily possible to select differing concentrations for the hydrofluoric acid and hydrochloric acid, such as those selected for the remaining exemplary embodiments, and for intermediate concentrations that are between the concentrations mentioned thereof.

Second to Fourth Exemplary Embodiments (FIGS. 3a-c):

An 800 nm thick ZnO layer was applied to a glass substrate by means of cathode sputtering. The coating parameters were selected as in exemplary embodiment 1. The glass panel coated with zinc oxide is etched for various etching durations with mixtures having differing ratios of hydrochloric acid to hydrofluoric acid (HCl:HF). The exact parameters are shown in Table 1. Craters of differing sizes develop in the ZnO layer depending on the mixing ratio of the two acids in relation to each other (see FIGS. 3a-c). The rms roughness tends to increase only slightly (from 105 nm for pure 1 wt % HF to over 125 nm for mixtures of the two acids to 139 nm for pure 0.5 wt % HCl) for etching solutions in which the relative HCl content is increased. The crosswise correlation length, which here constitutes a measure of the mean crater diameter, increases with a higher relative HCl content in the etching solution (from 181 nm for 0% HCl content to 644 nm for 100% HCl content). The layer ablation was approximately 150 nm for all etched layers. The rms roughness values and the crosswise correlation lengths are shown in Table 1.

TABLE 1

Mixing ratios of HF and HCl and related etching times as well as rms roughness values and crosswise correlation lengths. Processes a to c correspond to exemplary embodiments 2 to 4 according to the invention, and process d corresponds to the prior art.

| FIG. 3 | HF % wt. | HCl % wt. | HCl/(HF + HCl) % | etching duration sec. | rms roughness nm | crosswise correlation length (nm) |
|---|---|---|---|---|---|---|
| a | 1 | 0 | 0 | 70 | 105 | 181 |
| b | 1 | 0.5 | 33 | 35 | 127 | 252 |
| c | 1 | 0.75 | 43 | 25 | 125 | 434 |
| d | 0 | 0.5 | 100 | 40 | 139 | 644 |

The concentrations of hydrofluoric acid and hydrochloric acid have no limiting effect and are provided by way of example only. It is thus easily possible to select differing concentrations for the hydrofluoric acid and hydrochloric acid, such as those selected, for example, for the remaining exemplary embodiments and, as a matter of course, intermediate concentrations that are between the concentrations mentioned.

Fifth Exemplary Embodiment

An 800 nm tick zinc oxide layer 800 was applied to a glass substrate by means of cathode sputtering at a high dynamic deposition rate with a moving substrate of more than 100 nm*m/min (approximately 7 nm/s). The following coating parameters were selected: a ceramic ZnO:$Al_2O_3$ tube target having a $Al_2O_3$ content of 0.5 percent by weight; medium frequency (mf) excitation of the dual cathode at 40 MHz, cleaned Corning Glass Eagle XG; process gas: argon; operating pressure $20*10^{-3}$ mbar; generator power 14 W/cm², argon gas flow: 200 standard cubic centimeters (sccm); substrate temperature 350° C.; sputtering system: from Ardenne Anlagentechnik (VISS 300).

The glass panel coated with the zinc oxide layer is etched for 120 seconds in a 1 wt % HF solution. Sharp-edged craters that are uniformly dispersed over the surface develop (see FIG. 4a), while a layer etched in 0.5 wt % HCl, as the prior art, has only flat craters similar to the type-3 surface (see FIG. 4b).

The ZnO layers shown allow good light scattering and thereby increased quantum efficiencies in silicon thin-film solar cells.

A step of briefly etching the structure subsequent to FIG. 4a in 0.5 wt % HCl for 4 seconds, for example, modifies the surface and smoothes the edges. The zinc oxide layer according to FIG. 5 is obtained.

The zinc oxide layer shown according to FIG. 5 also allows good light scattering with a high quantum efficiency and also good electrical properties in thin-film solar cells.

The concentrations of hydrofluoric acid and hydrochloric acid again have no limiting effect and are provided by way of example only. It is thus easily possible to select differing concentrations for the hydrofluoric acid and hydrochloric acid, for example such as those selected for the remaining exemplary embodiments and, as a matter of course, intermediate concentrations that are between the concentrations mentioned.

Sixth to Eleventh Exemplary Embodiments

Zinc oxide layers were etched in HF of various concentrations. Ablation of approximately 50 to 500 nm was targeted. For this purpose, ZnO layers as described in exemplary embodiment 1 were employed.

Samples were etched in 4 wt %, 2 wt %, 1 wt %, 0.5 wt %, 0.25 wt % and 0.125 wt % hydrofluoric acid. With the exception of the 1 wt % solution (70 seconds), all samples were etched for 120 seconds. The resulting surfaces are shown in FIGS. 6a-f. Low acid concentrations (less than ~0.125 wt %) result in flat craters having diameters of up to 1000 nm. The use of HF-containing solutions having a higher concentration of acid (>0.125%) tends to result in more sharp-edged, deeper craters having smaller diameters of less than 300 nm. Thus, for the first time, the acid concentration of the hydrofluoric acid represents a parameter for deliberately adjusting the sizes of structures on the zinc oxide layer after etching.

The concentrations of hydrofluoric acid and different acids in the exemplary embodiments shall not be considered to be limiting but are merely exemplary. Of course it is possible to select differing concentrations for these acids, for example intermediate concentrations that are between the aforementioned concentrations.

Moreover, instead of hydrochloric acid, it is also possible to use phosphoric acid, sulfuric acid, nitric acid, acetic acid or citric acid in the exemplary embodiments, or another suitable acid, which may optionally also be an organic acid.

The invention claimed is:

1. A method for producing a zinc oxide layer on a flexible or rigid substrate by depositing the zinc oxide layer onto said substrate, in which the zinc oxide layer has a crater density and a crater structure that can be adjusted homogeneously and independently of deposition conditions by etching, the method comprising the steps of sputtering zinc oxide on to a substrate to provide a deposited zinc oxide layer, etching the deposited zinc oxide layer in at least first and second etching steps, etching in the first etching step with hydrofluoric acid in a concentration of more than 0.125 wt % to 4 wt %, etching in the second etching step with one of an acid that is not hydrofluoric acid or hydrofluoric acid in a concentration different from the hydrofluoric acid concentration employed in the first etching step, whereby in the first etching step craters are formed in the deposited zinc oxide layer that have a diameter of less than 300 nm, the craters having a density of 5 to 100 $\mu m^{-2}$, and the craters have edges that are smoothed by the etching in the second etching step.

2. A method according to claim 1, wherein the first and second etching steps are practiced for a duration of 1 to 300 seconds.

3. The method according to claim 1, wherein in the second etching step, hydrofluoric acid is used in a concentration of 0.02 wt % to less than 0.125 wt %, whereby craters having diameters of up to 1000 nm are formed.

4. A method according to claim 1, wherein the deposited zinc oxide layer has a resistivity of less than $10^{-2}$ Ohm*cm.

5. A method according to claim 4, wherein zinc oxide is sputtered on to the substrate at a static deposition rate of at least 5 nm/s.

6. The method of claim 1 wherein in the second etching step an acid that is not hydrofluoric acid is employed, the acid being selected from hydrochloric acid, phosphoric acid, sulfuric acid, nitric acid, acetic acid, and citric acid.

7. The method of claim 1 wherein in the second etching step an acid that is not hydrofluoric acid is employed, the acid being selected from an organic acid.

8. A method for producing a zinc oxide layer on a flexible or rigid substrate by depositing the zinc oxide layer onto said substrate, in which the zinc oxide layer has a crater density and the crater structure of the zinc oxide layer can be adjusted homogeneously and independently of the deposition conditions, the method comprising the steps of sputtering zinc oxide on to a substrate to provide a deposited zinc oxide layer, etching the deposited zinc oxide layer in first and second etching steps, etching with hydrofluoric acid in the first etching step in a concentration of more than 0.125 wt % to 4 wt %, whereby a crater size having a diameter of less than 300 nm is provided; and etching in the second etching step with hydrofluoric acid in a concentration of 0.02 wt % to less than 0.125 wt %, whereby a crater size having a diameter of more than 300 nm up to 1000 nm is provided.

9. A method according to claim 8, wherein the first and second etching steps are practiced for a duration of 1 to 300 seconds.

10. A method according to claim 8, wherein the deposited zinc oxide layer has a resistivity of less than $10^{-2}$ Ohm*cm.

11. A method according to claim 10, wherein zinc oxide is sputtered on to the substrate at a static deposition rate of at least 5 nm/s.

12. A method for producing a zinc oxide layer on a substrate, in which the produced zinc oxide layer has a double structure surface of first craters within second craters to achieve a roughness for scattering light, wherein crater density and crater size is homogeneously and reproducibly controlled according to applied etching solutions and etching processes, the method comprising:
   sputtering zinc oxide on the substrate by sputtering to achieve a deposited zinc oxide layer having a c-axis texture; and
   etching the deposited layer in first and second etching processes to achieve said homogeneously and reproducibly controlled crater density and crater size of said first craters within second craters; and
   wherein said etching comprises etching the deposited layer in the first etching process using a first etching solution to produce said first craters, and etching the deposited layer in the second etching process using a second etching solution to achieve said second craters, said second craters being on average larger than craters formed by the first etching process, said first craters occurring at a crater density of 5 to 100 $\mu m^{-2}$ which is greater than a crater density of said second craters; and
   wherein the first etching solution comprises using hydrofluoric acid at a concentration of more than 0.125 wt % to 4 wt %, and the second etching solution comprises one of an acid that is not hydrofluoric acid or hydrofluoric acid in a concentration different than the hydrofluoric acid concentration employed in the first etching process.

13. The method of claim 12, wherein the second etching process achieves said second craters at a crater density of 0.3 to 3.0 $\mu m^{-2}$.

14. The method of claim 12, wherein the second etching process is performed after the first etching process and smooths edges of the second craters while also forming said first craters.

15. The method of claim 12, in which said step of sputtering zinc oxide on to the substrate occurs at a deposition rate of more than 5 nm/s.

16. The method of claim 12, in which said step of sputtering zinc oxide on to the substrate occurs at a deposition rate of more than 10 nm/s.

17. The method of claim 12, wherein said etching the deposited layer in first and second etching processes achieves a rms roughness of 105 to 139 nm for the produced zinc oxide layer.

18. The method of claim 12, wherein said etching the deposited layer in the first etching process is performed for a duration of 1 to 300 seconds, and wherein said etching the deposited layer in the second etching process is performed for a duration of 1 to 300 seconds.

* * * * *